United States Patent
Chou et al.

(10) Patent No.: US 12,159,906 B2
(45) Date of Patent: Dec. 3, 2024

(54) SEMICONDUCTOR DEVICE AND FABRICATION METHOD THEREOF

(71) Applicant: INNOSCIENCE (SUZHOU) TECHNOLOGY CO., LTD., Suzhou (CN)

(72) Inventors: Yi-Lun Chou, Suzhou (CN); Peng-Yi Wu, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 707 days.

(21) Appl. No.: 17/289,731

(22) PCT Filed: Jan. 26, 2021

(86) PCT No.: PCT/CN2021/073739
§ 371 (c)(1),
(2) Date: Apr. 29, 2021

(87) PCT Pub. No.: WO2022/160089
PCT Pub. Date: Aug. 4, 2022

(65) Prior Publication Data
US 2022/0384583 A1 Dec. 1, 2022

(51) Int. Cl.
*H01L 29/205* (2006.01)
*H01L 29/20* (2006.01)
(Continued)

(52) U.S. Cl.
CPC ........ *H01L 29/205* (2013.01); *H01L 29/2003* (2013.01); *H01L 29/66462* (2013.01); *H01L 29/7786* (2013.01)

(58) Field of Classification Search
CPC ........... H01L 29/7786; H01L 29/66462; H01L 21/02513; H01L 29/32
See application file for complete search history.

(56) References Cited

U.S. PATENT DOCUMENTS

| | | |
|---|---|---|
| 2004/0074437 A1 | 4/2004 | Fang et al. |
| 2009/0014713 A1 | 1/2009 | Kang et al. |
| | (Continued) | |

FOREIGN PATENT DOCUMENTS

| | | |
|---|---|---|
| CN | 101621094 A | 1/2010 |
| CN | 102656711 A | 9/2012 |
| | (Continued) | |

OTHER PUBLICATIONS

Notice of Allowance of the corresponding China patent application No. 202180000640.0 mailed on Apr. 1, 2022.
(Continued)

*Primary Examiner* — Ali Naraghi
*Assistant Examiner* — E. Rhett Cheek
(74) *Attorney, Agent, or Firm* — JCIPRNET

(57) ABSTRACT

The present disclosure provides a semiconductor device and a fabrication method thereof. The semiconductor device includes a substrate, a first nitride semiconductor layer, a second nitride semiconductor layer, and a carbonitride semiconductor layer. The first nitride semiconductor layer is over the substrate. The second nitride semiconductor layer is formed on the first nitride semiconductor layer and has a greater bandgap than that of the first nitride semiconductor layer. The carbonitride semiconductor layer is between the substrate and the first nitride semiconductor layer.

14 Claims, 8 Drawing Sheets

(51) Int. Cl.
*H01L 29/66* (2006.01)
*H01L 29/778* (2006.01)

(56) References Cited

U.S. PATENT DOCUMENTS

| | | | |
|---|---|---|---|
| 2010/0244101 A1* | 9/2010 | Kokawa | H01L 21/02502 257/E29.081 |
| 2011/0084311 A1 | 4/2011 | Nelson et al. | |
| 2014/0077266 A1* | 3/2014 | Ramdani | H01L 29/778 257/194 |
| 2014/0264455 A1* | 9/2014 | Keller | H01L 21/0254 257/194 |
| 2015/0357419 A1* | 12/2015 | Lutgen | H01L 29/205 257/201 |
| 2018/0204908 A1* | 7/2018 | Sato | H01L 21/0254 |
| 2018/0204941 A1* | 7/2018 | Odnoblyudov | H01L 21/0217 |
| 2019/0123138 A1* | 4/2019 | Leobandung | H01L 29/413 |

FOREIGN PATENT DOCUMENTS

| | | |
|---|---|---|
| CN | 103730553 A | 4/2014 |
| CN | 104412395 A | 3/2015 |
| CN | 107464841 A | 12/2017 |
| CN | 110177905 A | 8/2019 |
| CN | 112119505 A | 12/2020 |
| EP | 2704184 A1 | 3/2014 |
| KR | 101363760 B1 * | 2/2014 |

OTHER PUBLICATIONS

International Search Report and Written Opinion of the corresponding PCT application No. PCT/CN2021/073739 mailed on Oct. 25, 2021.

First Office Action of the corresponding China patent application No. 202180000640.0 mailed on Dec. 31, 2021.

* cited by examiner

SEMICONDUCTOR DEVICE AND FABRICATION METHOD THEREOF

BACKGROUND

1. Technical Field

The present disclosure relates to a semiconductor device and a fabrication method thereof.

2. Description of the Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies) due to their characteristics.

The semiconductor components may include a heterojunction bipolar transistor (HBT), a heterojunction field effect transistor (HFET), a high-electron-mobility transistor (HEMT), a modulation-doped FET (MODFET) and the like.

SUMMARY OF THE INVENTION

In some embodiments of the present disclosure, a semiconductor device is provided, which includes a substrate, a first nitride semiconductor layer, a second nitride semiconductor layer, and a carbonitride semiconductor layer. The first nitride semiconductor layer is over the substrate. The second nitride semiconductor layer is formed on the first nitride semiconductor layer and has a greater bandgap than that of the first nitride semiconductor layer. The carbonitride semiconductor layer is between the substrate and the first nitride semiconductor layer.

In some embodiments of the present disclosure, a semiconductor device is provided, which includes a substrate, a first nitride semiconductor layer, a second nitride semiconductor layer, a buffer layer, and a dislocation reduction layer. The first nitride semiconductor layer is over the substrate. The second nitride semiconductor layer is formed on the first nitride semiconductor layer and has a greater bandgap than that of the first nitride semiconductor layer. The buffer layer is between the substrate and the first nitride semiconductor layer. The dislocation reduction layer is between the substrate and the first nitride semiconductor layer. A portion of the dislocation reduction layer is adjacent to an interface of the buffer layer and the first nitride semiconductor layer.

In some embodiments of the present disclosure, a method for manufacturing a semiconductor device is provided. The method includes forming a carbonitride semiconductor layer over a substrate. The method also includes forming a first nitride semiconductor layer over the carbonitride semiconductor layer. The method further includes forming a second nitride semiconductor layer on the first nitride semiconductor layer, the second nitride semiconductor layer having a greater bandgap than that of the first nitride semiconductor layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

PREFERRED EMBODIMENT OF THE PRESENT INVENTION

Figure 1:
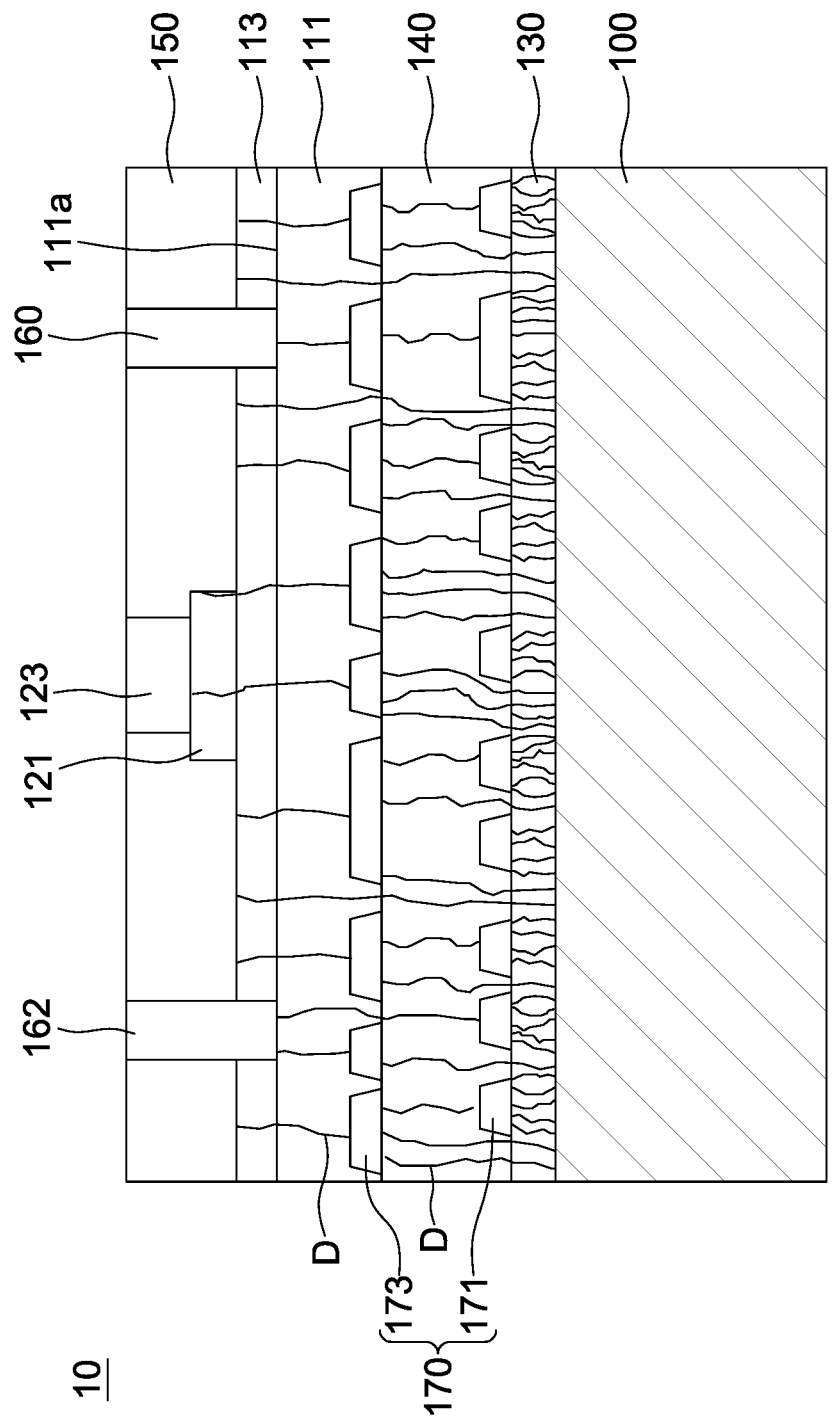
FIG. 1 is a cross-sectional view of a semiconductor device according to some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a semiconductor device 10 according to some embodiments of the present disclosure. The semiconductor device 10 can work in various voltage levels. For example, the semiconductor device 10 can work in a relatively high voltage level (e.g., equal to or greater than approximately about 200 V).

The semiconductor device 10 may include a substrate 100, nitride semiconductor layers 111, 113 and 130, a buffer layer 140, a dislocation reduction layer 170, a doped group III-V semiconductor layer 121, a metal layer 123, a dielectric layer 150, a drain electrode 160, and a source electrode 162.

The substrate 100 may include, without limitation, silicon (Si), doped Si, silicon carbide (SiC), germanium silicide (SiGe), gallium arsenide (GaAs), sapphire, silicon on insulator (SOI), or other suitable material(s). The substrate 100 may further include a doped region, for example, a p-well, an n-well, or the like. The substrate 100 may include impurity.

The nitride semiconductor layer 111 may be formed over the substrate 100. The nitride semiconductor layer 111 has a surface 111a. The nitride semiconductor layer 111 may include, without limitation, a group III nitride, for example, a compound $In_xAl_yGa_{1-x-y}N$, in which $x+y \leq 1$. The group III nitride may further include, but is not limited to, for example, a compound $Al_yGa_{(1-y)}N$, in which $y \leq 1$. For example, the nitride semiconductor layer 111 may include a GaN layer having a bandgap of about 3.4 eV.

The nitride semiconductor layer 113 (also referred to as "a barrier layer") may be formed on the surface 111a of the nitride semiconductor layer 111. The nitride semiconductor layer 113 may have a greater bandgap than that of the nitride semiconductor layer 111. The nitride semiconductor layer 113 may be in direct contact with the surface 111a of the nitride semiconductor layer 111. The nitride semiconductor layer 113 may include, without limitation, a group III nitride, for example, a compound $In_x Al_y Ga_{1-x-y} N$, in which x+y≤1. The group III nitride may further include, but is not limited to, for example, a compound $Al_y Ga_{(1-y)} N$, in which y≤1. For example, the nitride semiconductor layer 113 may include AlGaN having a band gap of about 4 eV.

A heterojunction may be formed between the nitride semiconductor layer 111 and the nitride semiconductor layer 113, e.g., at an interface of the nitride semiconductor layer 111 and the nitride semiconductor layer 113, and the polarization of the heterojunction of different nitrides forms a two-dimensional electron gas (2DEG) region adjacent to the interface of the nitride semiconductor layer 111 and the nitride semiconductor layer 113. The 2DEG region may be formed in the nitride semiconductor layer 111. The nitride semiconductor layer 111 can provide electrons to or remove electrons from the 2DEG region, thereby controlling the conduction of the semiconductor device 10.

The doped group III-V semiconductor layer 121 may be over the nitride semiconductor layer 113. The doped group III-V semiconductor layer 121 may directly contact the nitride semiconductor layer 113. The doped group III-V semiconductor layer 121 may be or include a p-type doped group III-V layer. The doped group III-V semiconductor layer 121 may be made of or include an epitaxial p-type III-V material. The doped group III-V semiconductor layer 121 may include, for example, but is not limited to, group III nitride, for example, a compound $Al_y Ga_{(1-y)} N$, in which y≤1. The doped group III-V semiconductor layer 121 may be or include p-type doped GaN.

The metal layer 123 (also referred to as "a metal gate") may be disposed over the doped group III-V semiconductor layer 121. The metal layer 123 may directly contact the doped group III-V semiconductor layer 121. The metal layer 123 may include a conductive layer. The metal layer 123 may be or include a gate metal. The gate metal may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The 2DEG region formed under the doped group III-V semiconductor layer 121 may be preset to be in an OFF state when the metal layer 123 is in a zero-bias state. When a voltage is applied to the metal layer 123, electrons or charges are induced in the 2DEG region below the metal layer 123. When the voltage increases, the number of induced electrons or charges increases as well. Such a device can be referred to as an enhancement-mode device.

The nitride semiconductor layer 130 may be on the substrate 100. The nitride semiconductor layer 130 may be or include a nucleation layer. The nitride semiconductor layer 130 may include, for example but not limited to, nitrides, for example, aluminum nitride (AlN) aluminum gallium nitride (AlGaN), or a combination thereof.

The buffer layer 140 may be on the nitride semiconductor layer 130. The buffer layer 140 may directly contact the nitride semiconductor layer 130. The buffer layer 140 may be between the substrate 100 and the nitride semiconductor layer 111. The buffer layer 140 may directly contact the nitride semiconductor layer 111. The buffer layer 140 may be or include a super lattice layer. The super lattice layer formed between the substrate 100 and the nitride semiconductor layer 111 may facilitate operation of the semiconductor device 10 in a relatively high voltage level. The buffer layer 140 may be configured to improve lattice match between the substrate 100 and layers (for example, the nitride semiconductor layer 111 above the substrate 100) over the substrate 100. The buffer layer 140 may reduce a tensile stress of the semiconductor device 10. The buffer layer 140 may reduce or prevent defects (for example, a dislocation) from propagating from the substrate 100 to the nitride semiconductor layer 111, thereby avoiding the dysfunction of the semiconductor device 10.

The buffer layer 140 may include, for example but not limited to, nitrides, for example, AlN, AlGaN, gallium nitride (GaN), or a combination thereof. The buffer layer 140 may include a dopant. The dopant may include one or more relatively high resistance dopants. The dopant may include carbon, iron, magnesium, or a combination thereof. The concentration of carbon in the buffer layer 140 may be less than about $10^{20}$ atoms/cm$^3$. The concentration of carbon in the buffer layer 140 may be from about $10^{15}$ atoms/cm$^3$ to about $10^{20}$ atoms/cm$^3$. The buffer layer 140 may have a sheet resistance that is equal to or greater than about $10^5$ Ω/□.

The dislocation reduction layer 170 may be between the substrate 100 and the nitride semiconductor layer 111. The dislocation reduction layer 170 may be in contact with the nitride semiconductor layer 111. The dislocation reduction layer 170 may be within a portion of the nitride semiconductor layer 111. The dislocation reduction layer 170 may be between the buffer layer 140 and the nitride semiconductor layer 111. A portion of the dislocation reduction layer 170 may be adjacent to an interface of the buffer layer 140 and the nitride semiconductor layer 111. The dislocation reduction layer 170 may be in contact with the buffer layer 140. The dislocation reduction layer 170 may be within a portion of the buffer layer 140. The dislocation reduction layer 170 may be arranged at or proximal to the interface between the nitride semiconductor layer 111 and the buffer layer 140. The dislocation reduction layer 170 may be arranged at or proximal to the interface between the nitride semiconductor layer 130 and the buffer layer 140. The dislocation reduction layer 170 may be or include a carbonitride semiconductor layer. The carbonitride semiconductor layer may include CN, GaCN, SiInCN, SiCN, SiGaCN, or a combination thereof. A concentration of carbon in the dislocation reduction layer 170 may be greater than a concentration of carbon in the buffer layer 140. The dislocation reduction layer 170 may be free of silicon nitride. The dislocation reduction layer 170 may be free of a silicon nitride layer.

The dislocation reduction layer 170 disposed between the substrate 100 and the nitride semiconductor layer 111 can reduce or prevent the propagation or diffusion of dislocations D (also referred to as "crystallographic defects") from the substrate 100 towards the nitride semiconductor layer 111 during the formation process (e.g., epitaxial growth) of the nitride semiconductor layer 111, and thus the crystallographic defects within the nitride semiconductor layer 111 can be reduced. Therefore, the device current leakage can be reduced, the voltage tolerance of the semiconductor device 10 can be increased, and the reliability of the semiconductor device 10 can be improved.

In addition, the dislocation reduction layer 170 may be free of silicon nitride, such that the formation process of the dislocation reduction layer 170 can be free from using a silane source (e.g., $SiH_4$, $Si_2H_6$, and etc.), and thus the concentration of relatively high resistance dopant(s) (e.g., carbon, iron, and/or magnesium) adjacent or proximal to the dislocation reduction layer 170 can be prevented from being decreased by the undesired incorporation of the silane source. Therefore, the concentration of relatively high resistance dopant(s) in a layer (e.g., the buffer layer 140) adjacent or proximal to the dislocation reduction layer 170 can maintain at a satisfactory value, which is advantageous to further reducing the device current leakage and increasing the voltage tolerance of the semiconductor device 10. Furthermore, the dislocation reduction layer 170 may be disposed within the buffer layer 140, such that the sheet resistance of the buffer layer 140 can be increased, and thus the device current leakage can be further reduced.

Moreover, in some cases where a semiconductor device includes a substrate, a high resistance layer on the substrate, and nitride semiconductor layers on the high resistance layer, and a silicon nitride layer, the silicon nitride layer is preferably arranged at a position distal to the nitride semiconductor layers where a 2DGE region is formed in order to reduce or prevent device current leakage. Since the dislocation reduction layer 170 that is free of silicon nitride does not reduce the concentration of relatively high resistance dopant(s), the dislocation reduction layer 170 can be arranged at various positions regardless of the resistance values thereof, such as at the interface between the nitride semiconductor layer 111 and the buffer layer 140 or within a relatively high resistance layer (e.g., the buffer layer 140). Therefore, the dislocation reduction layer 170 can achieve reducing crystallographic defects and device current leakage concurrently, and the dislocation reduction layer 170 can be arranged at various positions according to actual needs, without limited to a position distal to the nitride semiconductor layers 111 and 113.

The dislocation reduction layer 170 may include one or more carbonitride sub-layers (e.g., sub-layers 171 and 173). At least one of the carbonitride sub-layers (e.g., the sub-layer 173) may be within the buffer layer 140. The sub-layers 171 and 173 of the dislocation reduction layer 170 may be in contact with the buffer layer 140. The sub-layer 171 of the dislocation reduction layer 170 may be within a portion of the buffer layer 140. The sub-layer 173 may be in contact with the buffer layer 140 and the nitride semiconductor layer 111. The sub-layer 173 of the dislocation reduction layer 170 may be in contact with the nitride semiconductor layer 111. The sub-layer 173 of the dislocation reduction layer 170 may be within a portion of the nitride semiconductor layer 111. The sub-layer 173 of the dislocation reduction layer 170 may be between the buffer layer 140 and the nitride semiconductor layer 111. The sub-layer 173 of the dislocation reduction layer 170 may be adjacent to an interface of the buffer layer 140 and the nitride semiconductor layer 111. The nitride semiconductor layer 130 may be between the substrate 100 and the dislocation reduction layer 170. The dislocation reduction layer 170 may be in contact with the nitride semiconductor layer 130. The number of sub-layers of the dislocation reduction layer 170 may vary according to actual specification and applications without limited to the numbers described herein.

The dislocation reduction layer 170 may include a plurality of segments or islands (e.g., separated portions of the sub-layer 171 and the sub-layer 173). The dislocation reduction layer 170 may include a plurality of segments or islands (e.g., the separated portions of the sub-layer 171) dispersed in the buffer layer 140. The dislocation reduction layer 170 may include a plurality of segments or islands (e.g., the separated portions of the sub-layer 173) dispersed in the nitride semiconductor layer 111. A first portion of the segments or islands (e.g., the separated portions of the sub-layer 171) of the dislocation reduction layer 170 and a second portion of the segments or islands (e.g., the separated portions of the sub-layer 173) of the dislocation reduction layer 170 may be at different elevations. At least one segment or island of the first portion of the segments or islands (e.g., the separated portions of the sub-layer 171) of the dislocation reduction layer 170 overlaps at least one segment or island of the second portion of the segments or islands (e.g., the separated portions of the sub-layer 173) of the dislocation reduction layer 170 from a top view perspective.

The nitride semiconductor layer 130 may have one or more dislocations D (or crystallographic defects). The aforesaid dislocations D (or defects) may be formed during the formation (e.g., the epitaxial growth) of the nitride semiconductor layer 130. The buffer layer 140 may have one or more dislocations D. The dislocations D (or defects) may be formed during the formation (e.g., the epitaxial growth) of the buffer layer 140. With the dislocation reduction layer 170 arranged at or proximal to the interface between the nitride semiconductor layer 130 and the buffer layer 140, the propagation or diffusion of the dislocations D (or defects) from the nitride semiconductor layer 130 towards the buffer layer 140 can be reduced or prevented. With the reduction of the dislocation density of the buffer layer 140, the quality of the buffer layer 140 and the nitride semiconductor layers formed thereon can be improved, and the performance and the reliability of the semiconductor device 10 can be improved.

The nitride semiconductor layer 111 may have one or more dislocations D. The aforesaid dislocations D (or defects) may be formed during the formation (e.g., the epitaxial growth) of the nitride semiconductor layer 111. With the dislocation reduction layer 170 arranged at or proximal to the interface between the nitride semiconductor layer 111 and the buffer layer 140, the propagation or diffusion of the dislocations D (or defects) from the buffer layer 140 towards the nitride semiconductor layer 111 can be further reduced or prevented. With the reduction of the dislocation density of the nitride semiconductor layer 111, the quality of the nitride semiconductor layer 111 and the nitride semiconductor layer 113 formed thereon can be further improved, and the performance and the reliability of the semiconductor device 10 can be improved.

The dislocation density of the buffer layer 140 may be less than the dislocation density of the nitride semiconductor layer 130. The dislocation density of the nitride semiconductor layer 111 may be less than the dislocation density of the buffer layer 140.

The drain electrode 160 and the source electrode 162 may be disposed on two lateral sides of the metal layer 123. The drain electrode 160 and the source electrode 162 may include, for example, without limitation, one or more conductor materials. The conductor materials may include, but are not limited to, for example, metals, alloys, doped semiconductor materials (e.g., doped crystalline silicon), or other suitable conductor materials.

The dielectric layer 150 may be disposed over the nitride semiconductor layer 113. The doped group III-V semiconductor layer 121, the metal layer 123, the drain electrode 160 and the source electrode 162 are disposed within the dielectric layer 150. Upper surfaces of the doped group III-V semiconductor layer 121, the metal layer 123, the drain electrode 160 and the source electrode 162 may be exposed from an upper surface of the dielectric layer 150. The dielectric layer 150 may include silicon oxide, silicon nitride, silicon oxynitride, aluminum oxide, aluminum nitride, or a combination thereof.

Figure 2:
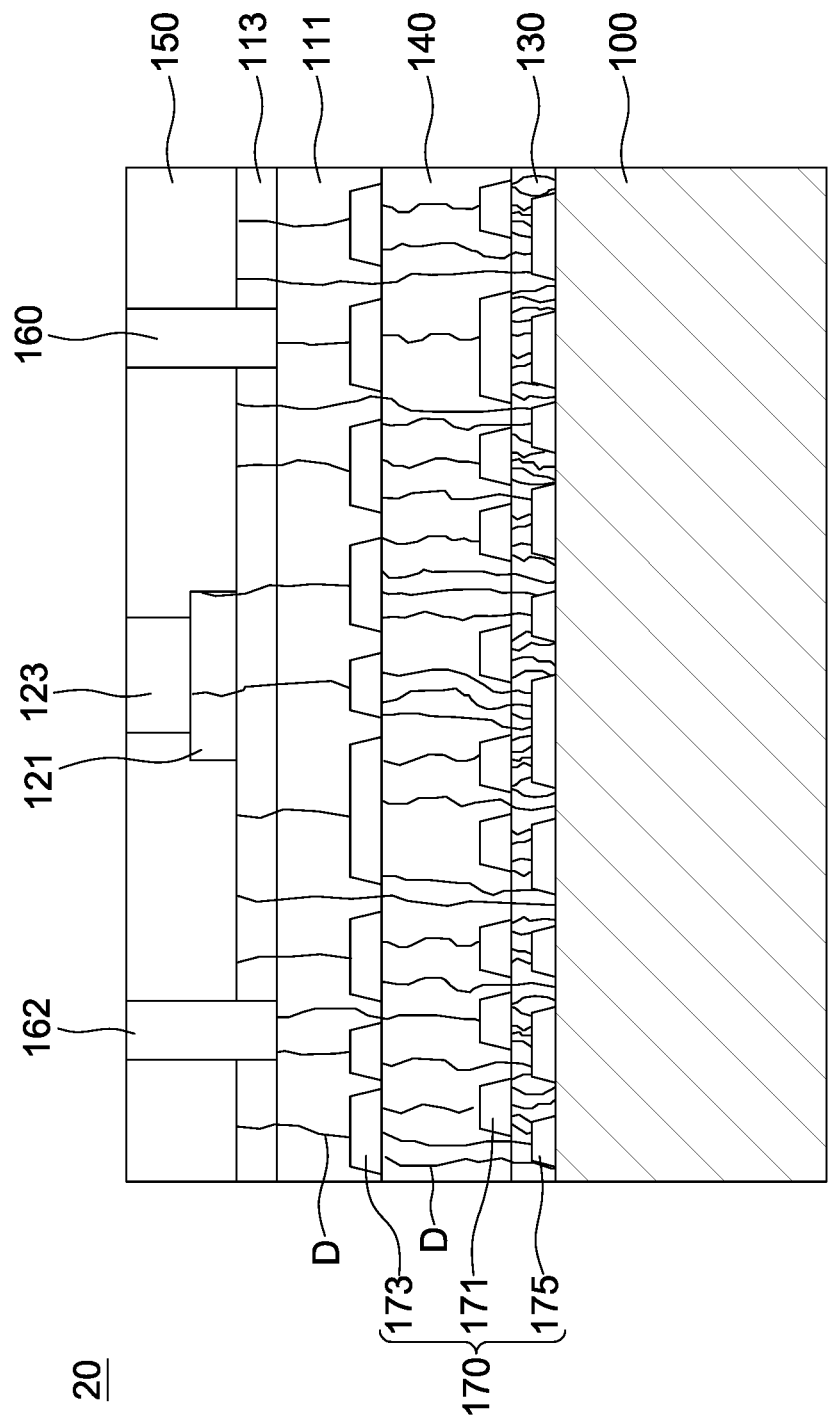
FIG. 2 is a cross-sectional view of a semiconductor device according to some embodiments of the present disclosure.

FIG. 2 is a cross-sectional view of a semiconductor device 20 according to some embodiments of the present disclosure. The semiconductor device 20 has a structure similar to the semiconductor device 10 shown in FIG. 1, except that, for example, the dislocation reduction layer 170 of the semiconductor device 20 may have a different structure.

The dislocation reduction layer 170 may include a plurality of carbonitride sub-layers (e.g., sub-layers 171, 173 and 175). At least one of the carbonitride sub-layers (e.g., the sub-layer 175) may be within the nitride semiconductor layer 130. The sub-layer 175 of the dislocation reduction layer 170 may be in contact with the substrate 100. The dislocation reduction layer 170 may be arranged at or proximal to the interface between the nitride semiconductor layer 130 and the substrate 100. The nitride semiconductor layer 130 may directly contact the substrate 100.

Dislocations D (or defects) may easily form in the nitride semiconductor layer 130 during the formation of the nitride semiconductor layer 130 on the substrate 100. For example, dislocations D (or defects) may easily form in an AlN layer or an AlGaN layer during the formation of the AlN layer or the AlGaN layer on a silicon substrate. With the dislocation reduction layer 170 arranged at or proximal to the interface between the nitride semiconductor layer 130 and the substrate 100, the propagation or diffusion of the dislocations D (or defects) from the substrate 100 towards the nitride semiconductor layer 130 can be reduced or prevented. With the reduction of the dislocation density of the nitride semiconductor layer 130, the quality of the nitride semiconductor layer 130 and the nitride semiconductor layers formed thereon can be improved, and the performance and the reliability of the semiconductor device 20 can be improved.

The sub-layer 175 of the dislocation reduction layer 170 may include a plurality of segments or islands dispersed in the nitride semiconductor layer 130. At least one of the segments or islands the sub-layer 171 or the sub-layer 173 of the dislocation reduction layer 170 overlaps at least one of the segments or islands of the sub-layer 175 of the dislocation reduction layer 170 from a top view perspective.

Figure 3:
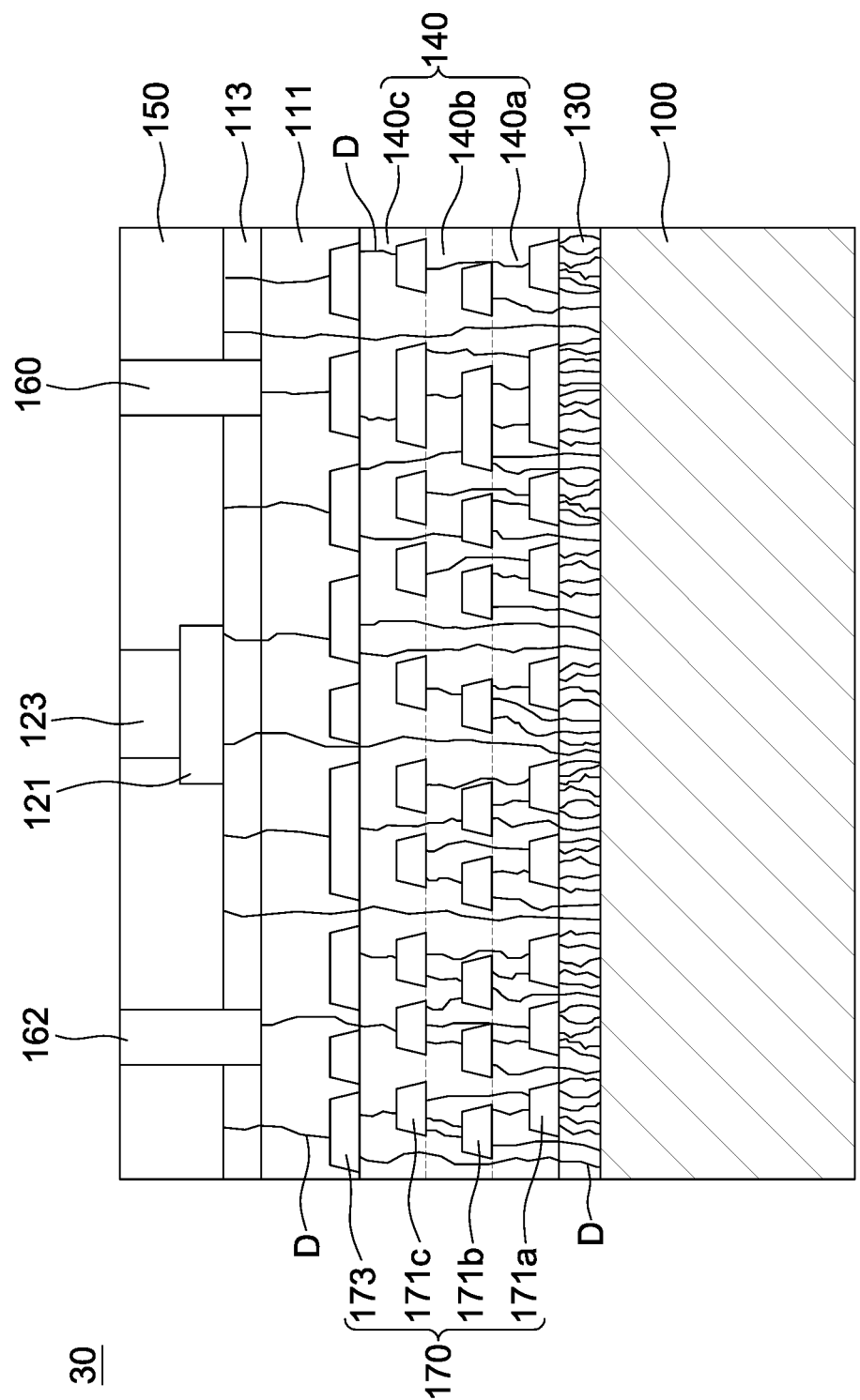
FIG. 3 is a cross-sectional view of a semiconductor device according to some embodiments of the present disclosure.

FIG. 3 is a cross-sectional view of a semiconductor device 30 according to some embodiments of the present disclosure. The semiconductor device 30 has a structure similar to the semiconductor device 10 shown in FIG. 1, except that, for example, the buffer layer 140 of the semiconductor device 30 may have a different structure.

The buffer layer 140 may include a multi-layer structure. The buffer layer 140 may include a multi-layer stack. The buffer layer 140 may include a plurality of buffer sub-layers (e.g., sub-layers 140a, 140b and 140c) between the substrate 100 and the nitride semiconductor layer 111. The buffer layer 140 may include, for example but not limited to, a plurality of GaN layers and a plurality of AlGaN layers that are stacked alternatively.

The dislocation reduction layer 170 may include a plurality of segments or islands (e.g., separated portions of sub-layers 171, 171a, 171b and 171c) dispersed in the buffer layer 140. The dislocation reduction layer 170 may include a plurality of carbonitride sub-layers (e.g., sub-layers 171a, 171b and 171c) between the plurality of buffer sub-layers (e.g., the sub-layers 140a, 140b and 140c). The buffer sub-layers of the buffer layer 140 and the carbonitride sub-layers of the dislocation reduction layer 170 may be stacked alternatively.

The sub-layer 173 of the dislocation reduction layer 170 may be in contact with the buffer layer 140 and the nitride semiconductor layer 111. The sub-layers 171b and 171c of the dislocation reduction layer 170 may be in the buffer layer 140. The sub-layers 171b and 171c of the dislocation reduction layer 170 may be spaced apart from the substrate 100 by the buffer layer 140.

FIGS. 4A, 4B, 4C, 4D, 4E and 4F illustrate several operations in manufacturing a semiconductor device according to some embodiments of the present disclosure.

Figure 4A:
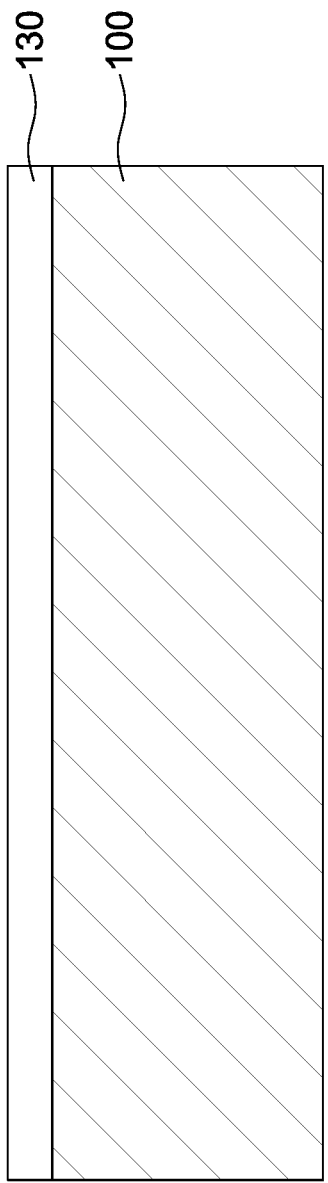
FIGS. 4A, 4B, 4C, 4D, 4E and 4F illustrate several operations in manufacturing a semiconductor device according to some embodiments of the present disclosure.

Referring to FIG. 4A, a substrate 100 may be provided, and a nitride semiconductor layer 130 may be formed on the substrate 100. The nitride semiconductor layer 130 may be formed by metal organic chemical vapor deposition (MOCVD), epitaxial growth, or other suitable deposition technique.

Figure 4B:
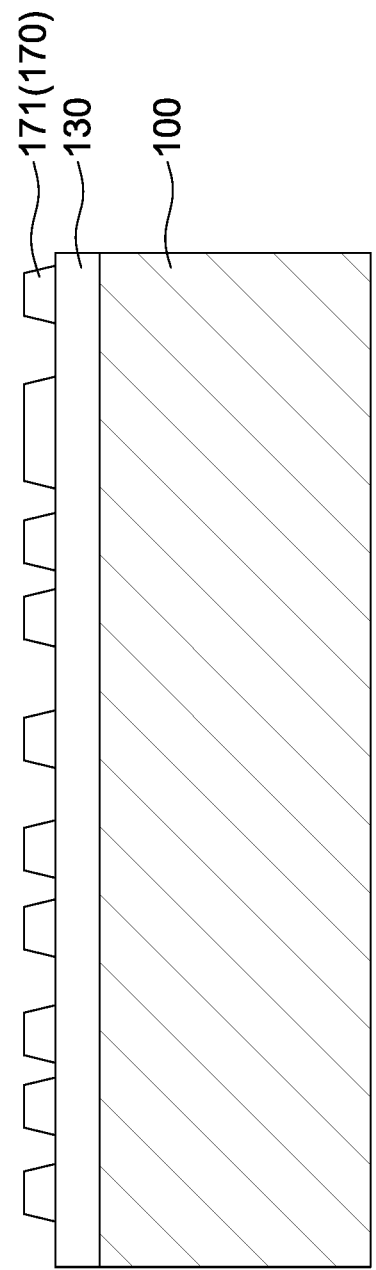

Referring to FIG. 4B, a sub-layer 171 of a dislocation reduction layer 170 may be formed over the substrate 100. The sub-layer 171 may be formed on the nitride semiconductor layer 130. The sub-layer 171 may include separated portions exposing an upper surface of the nitride semiconductor layer 130. The sub-layer 171 may be formed by MOCVD, epitaxial growth, or other suitable deposition technique. The sub-layer 171 of the dislocation reduction layer 170 may include CN, GaCN, SiInCN, SiCN, SiGaCN, or a combination thereof. The sub-layer 171 of the dislocation reduction layer 170 may be formed in situ with the nitride semiconductor layer 130. The sub-layer 171 may be formed by supplying a carbon source and a nitride source during the MOCVD operation. The sub-layer 171 of the dislocation reduction layer 170 may include CN, GaCN, or a combination thereof, and the MOCVD operation for forming the sub-layer 171 may be free from supplying a silicon source, such as a silane source (e.g., $SiH_4$, $Si_2H_6$, and etc.).

Figure 4C:
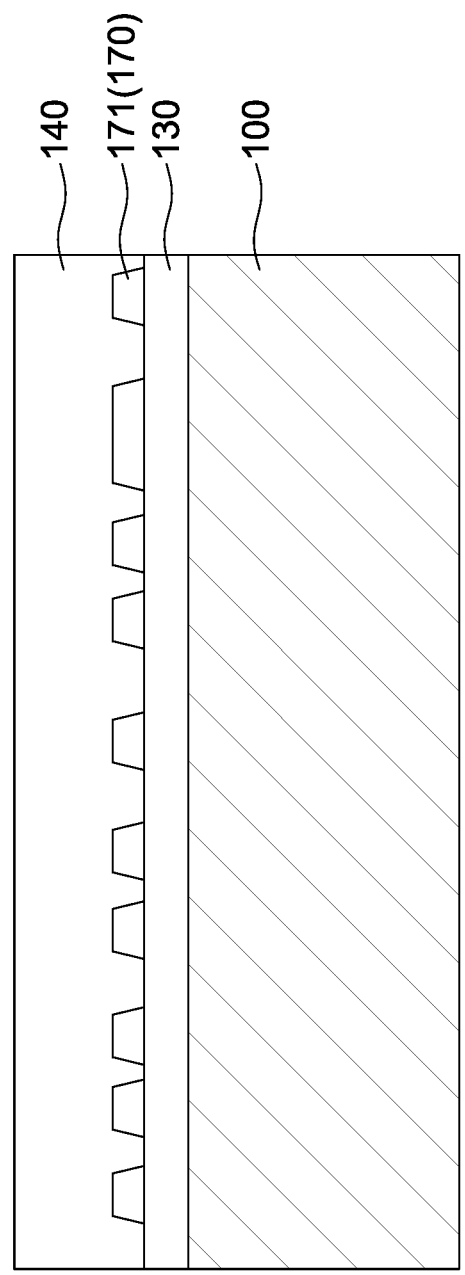

Referring to FIG. 4C, a buffer layer 140 may be formed over the substrate 100. The buffer layer 140 may be formed on the sub-layer 171 of the dislocation reduction layer 170. The buffer layer 140 may cover the sub-layer 171 of the dislocation reduction layer 170. The buffer layer 140 may be formed by MOCVD, epitaxial growth, or other suitable deposition technique. The buffer layer 140 may be further implanted by one or more dopants. The dopant may include one or more relatively high resistance dopants. The dopant may include carbon, iron, magnesium, or a combination thereof. The sub-layer 171 of the dislocation reduction layer 170 may be formed in situ with the buffer layer 140. Forming the sub-layer 171 of the dislocation reduction layer 170 on the substrate 100 may be prior to forming the buffer layer 140.

Figure 4D:
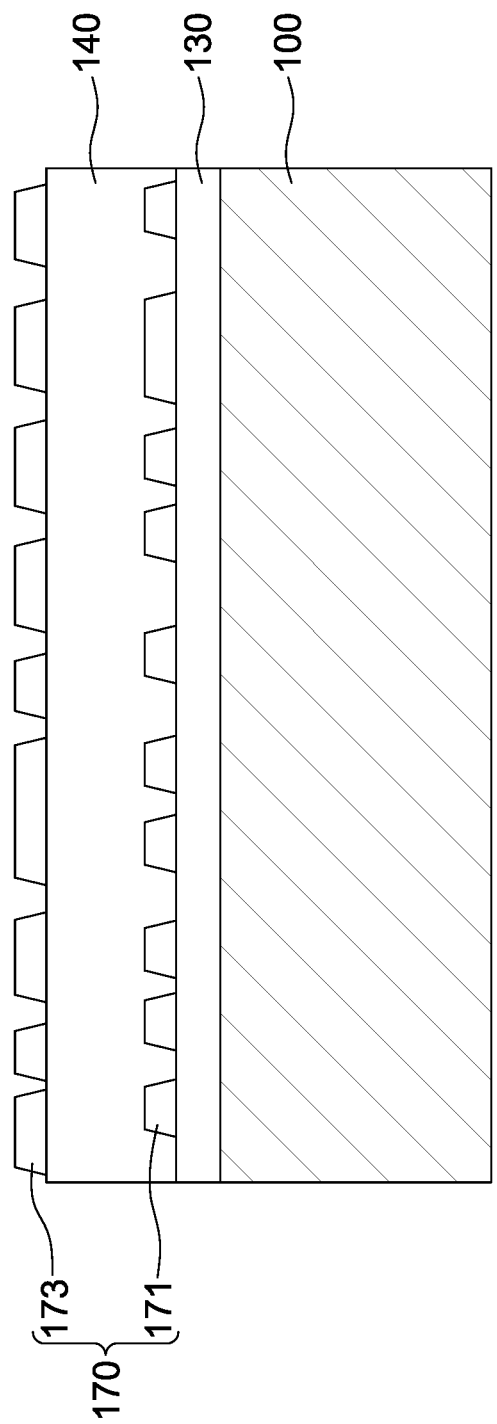

Referring to FIG. 4D, a sub-layer 173 of the dislocation reduction layer 170 may be formed on the buffer layer 140. The sub-layer 173 may include separated portions exposing an upper surface of the buffer layer 140. The sub-layer 173 may be formed by MOCVD, epitaxial growth, or other suitable deposition technique. The sub-layer 173 of the dislocation reduction layer 170 may include CN, GaCN, SiInCN, SiCN, SiGaCN, or a combination thereof. The sub-layer 173 of the dislocation reduction layer 170 may be formed in situ with the buffer layer 140. The sub-layer 173 may be formed by supplying a carbon source and a nitride source during the MOCVD operation. The sub-layer 173 of the dislocation reduction layer 170 may include CN, GaCN, or a combination thereof, and the MOCVD operation for forming the sub-layer 173 may be free from supplying a silicon source, such as a silane source (e.g., $SiH_4$, $Si_2H_6$, and etc.). Therefore, the concentration of relatively high resistance dopant(s) (e.g., carbon, iron, and/or magnesium) adjacent or proximal to the dislocation reduction layer 170 can be prevented from being decreased by the undesired incorporation of the silane source. Therefore, the concentration of relatively high resistance dopant(s) in a layer (e.g., the buffer layer 140) adjacent or proximal to the dislocation reduction layer 170 can maintain at a satisfactory value, which is advantageous to further reducing the device current leakage.

Figure 4E:
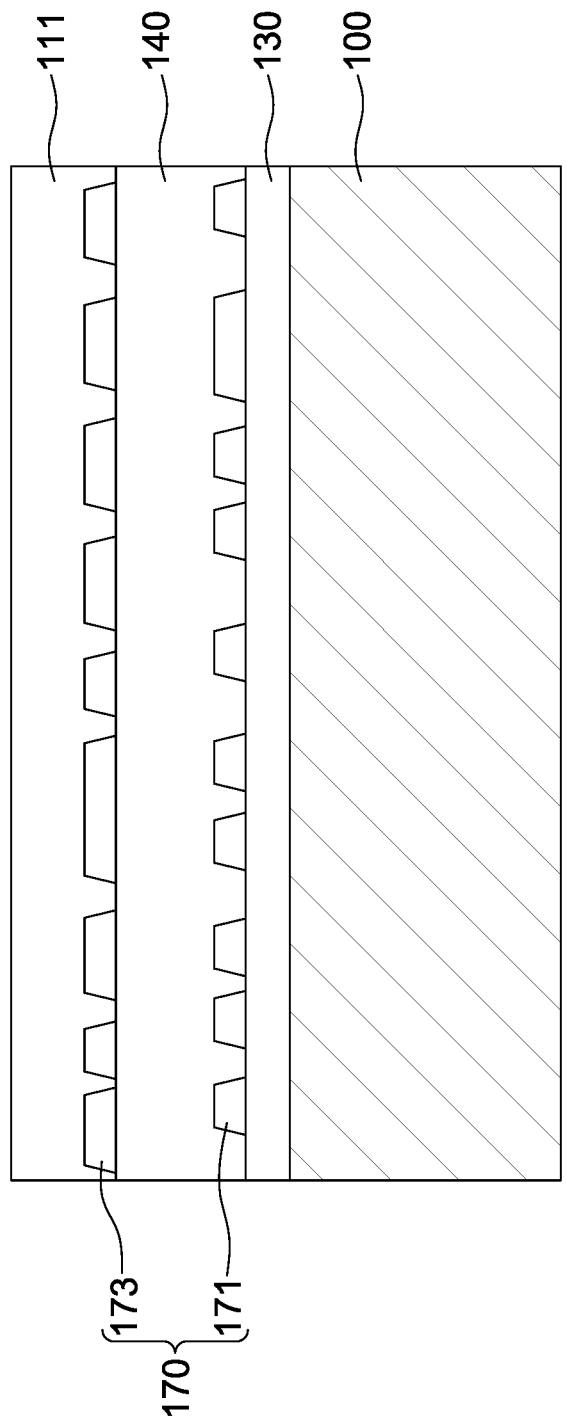

Referring to FIG. 4E, a nitride semiconductor layer 111 may be formed over the dislocation reduction layer 170 (e.g., the sub-layer 173 of the dislocation reduction layer 170). The nitride semiconductor layer 111 may be formed in situ with the sub-layer 173 of the dislocation reduction layer 170. The nitride semiconductor layer 111 may be formed by epitaxial growth. The sub-layer 173 of the dislocation reduction layer 170 may be formed prior to forming the nitride semiconductor layer 111.

In some cases where the dislocation reduction layer 170 may be or include silicon oxide, titanium nitride, and/or aluminum oxide, after the epitaxial layer(s) (e.g., the nitride semiconductor layer 130) is formed by a MOCVD apparatus, the as-formed intermediate structure may be moved from the MOCVD apparatus to another semiconductor manufacturing apparatus (e.g., a deposition or coating apparatus) to proceed the formation process of the dislocation reduction layer 170 including silicon oxide, titanium nitride, and/or aluminum oxide. After the aforesaid process is completed, the as-formed intermediate structure may then be moved from the semiconductor manufacturing apparatus to a MOCVD apparatus to proceed subsequent epitaxial processes. As the intermediate structure keeps being transferred from one apparatus to another apparatus, the manufacturing process may be relatively complicated, and contamination or underside remnants may occur.

The dislocation reduction layer 170 (e.g., the sub-layers 171 and 173) including carbonitride may be formed in situ with the nitride semiconductor layer 130. The dislocation reduction layer 170 (e.g., the sub-layers 171 and 173) including carbonitride may be formed in situ with the buffer layer 140. The dislocation reduction layer 170 (e.g., the sub-layers 171 and 173) including carbonitride may be formed in situ with the nitride semiconductor layer 130. Therefore, the intermediate structure can be free from being transferred from one apparatus to another apparatus during the formation operation of the dislocation reduction layer 170, thus the manufacturing process can be simplified, and contamination or underside remnants can be prevented.

Figure 4F:
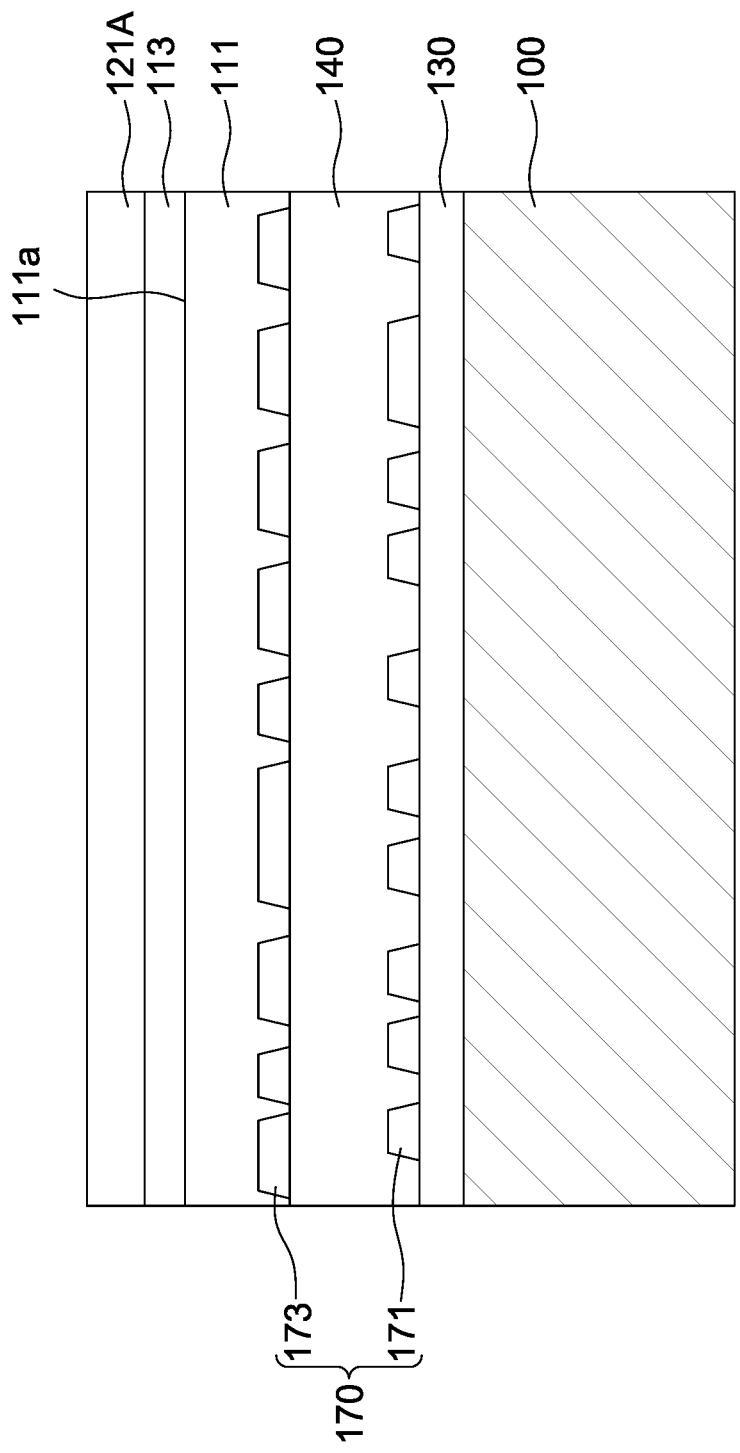

Referring to FIG. 4F, a nitride semiconductor layer 113 having a greater bandgap than that of the nitride semiconductor layer 111 may be formed on and in direct contact with the surface 111a of the nitride semiconductor layer 111, and a doped group III-V semiconductor layer 121A is formed on the nitride semiconductor layer 113. The nitride semiconductor layer 113 and the doped group III-V semiconductor layer 121A may be formed by epitaxial growth.

Next, referring to FIG. 1, the doped group III-V semiconductor layer 121A may be patterned to form a doped group III-V semiconductor layer 121, and a dielectric layer 150 may be formed over the doped group III-V semiconductor layer 121. The doped group III-V semiconductor layer 121 may be formed by disposing a patterned etch mask on the doped group III-V semiconductor layer 121A; etching the doped group III-V semiconductor layer 121A using the patterned etch mask to remove a portion of the doped group III-V semiconductor layer 121A; and removing the patterned etch mask. The dielectric layer 150 may be formed by a deposition process.

Next, still referring to FIG. 1, trenches may be formed penetrating the dielectric layer 150 to expose a portion of the doped group III-V semiconductor layer 121 and portions of the nitride semiconductor layer 111, and a conductive material may be formed in the trenches to form a drain electrode 160, a source electrode 162, and a metal layer 121 over the nitride semiconductor layer 111. The trenches may be formed by the following operations: disposing a patterned etch mask over the dielectric layer 150; etching the dielectric layer 150 using the patterned etch mask to remove portions of the dielectric layer 150 to expose the portion of the doped group III-V semiconductor layer 121 and the portions of the nitride semiconductor layer 111; and removing the patterned etch mask. As such, the semiconductor device 10 illustrated in FIG. 1 is formed.

In some other embodiments, after operations similar to those illustrated in FIGS. 4A-4B are performed, a plurality of buffer sub-layers (e.g., sub-layers 140a, 140b and 140c) may be formed on the substrate 100, and a plurality of carbonitride sub-layers (e.g., sub-layers 171a, 171b and 171c) may be formed between the plurality of buffer sub-layers (e.g., the sub-layers 140a, 140b and 140c). Next, operations similar to those illustrated in FIGS. 4D-4F may be performed. As such, a semiconductor device 30 illustrated in FIG. 3 is formed.

As used herein, spatially relative terms, such as "beneath," "below," "lower," "above," "upper," "over," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other techniques and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device, comprising:
a substrate;
a first nitride semiconductor layer over the substrate;
a second nitride semiconductor layer formed on the first nitride semiconductor layer and having a greater bandgap than that of the first nitride semiconductor layer;
a carbonitride semiconductor layer between the substrate and the first nitride semiconductor layer, wherein the carbonitride semiconductor layer comprises carbonitride sub-layers; and
a buffer layer between the substrate and the first nitride semiconductor layer, wherein the buffer layer comprises buffer sub-layers, and each of the carbonitride sub-layers comprises segments horizontally dispersed in one of the buffer sub-layers.

2. The semiconductor device according to claim 1, wherein the carbonitride semiconductor layer is in contact with the first nitride semiconductor layer.

3. The semiconductor device according to claim 1, wherein a concentration of carbon in the carbonitride semiconductor layer is greater than a concentration of carbon in the buffer layer.

4. The semiconductor device according to claim 1, wherein the buffer layer comprises a dopant, and the dopant comprises carbon, iron, magnesium, or a combination thereof.

5. The semiconductor device according to claim 1, wherein the carbonitride semiconductor layer comprises CN, GaCN, SiInCN, SiCN, SiGaCN, or a combination thereof.

6. A semiconductor device, comprising:
a substrate;
a first nitride semiconductor layer over the substrate;
a second nitride semiconductor layer formed on the first nitride semiconductor layer and having a greater bandgap than that of the first nitride semiconductor layer;
a buffer layer between the substrate and the first nitride semiconductor layer, wherein the buffer layer comprises buffer sub-layers; and
a dislocation reduction layer between the substrate and the first nitride semiconductor layer, wherein a portion of the dislocation reduction layer is adjacent to an interface of the buffer layer and the first nitride semiconductor layer, and the dislocation reduction layer comprises dislocation reduction sub-layers, and each of the dislocation reduction sub-layers comprises segments horizontally dispersed in one of the buffer sub-layers.

7. The semiconductor device according to claim 6, wherein the buffer layer has a sheet resistance that is equal to or greater than $10^5$ $\Omega/\square$.

8. The semiconductor device according to claim 6, wherein the dislocation reduction layer is within a portion of the first nitride semiconductor layer.

9. The semiconductor device according to claim 6, wherein the dislocation reduction layer is in contact with the buffer layer.

10. The semiconductor device according to claim 6, wherein a concentration of carbon in the dislocation reduction layer is greater than a concentration of carbon in the buffer layer.

11. The semiconductor device according to claim 6, wherein the dislocation reduction sub-layers comprise:
a first sub-layer in contact with the buffer layer and the first nitride semiconductor layer.

12. The semiconductor device according to claim 11, wherein the dislocation reduction sub-layers further comprise:
a second sub-layer in the buffer layer and spaced apart from the substrate by the buffer layer.

13. A method for fabricating a semiconductor device, comprising:
forming a carbonitride semiconductor layer over a substrate;
forming a first nitride semiconductor layer over the carbonitride semiconductor layer;
forming a second nitride semiconductor layer on the first nitride semiconductor layer, the second nitride semiconductor layer having a greater bandgap than that of the first nitride semiconductor layer; and
forming a buffer layer on the substrate, wherein the carbonitride semiconductor layer is formed in situ with the buffer layer;
wherein forming the buffer layer comprises:
forming a plurality of buffer sub-layers on the substrate; and
wherein forming the carbonitride semiconductor layer comprises forming a plurality of carbonitride sub-layers between the plurality of buffer sub-layers, wherein each of the carbonitride sub-layers comprises segments horizontally dispersed in one of the buffer sub-layers.

14. The method according to claim 13, wherein forming the carbonitride semiconductor layer comprises:
forming a first carbonitride sub-layer on the substrate prior to forming the buffer layer; and
forming a second carbonitride sub-layer on the buffer layer prior to forming the first nitride semiconductor layer.

* * * * *